(12) United States Patent
Zang

(10) Patent No.: US 12,501,807 B2
(45) Date of Patent: Dec. 16, 2025

(54) DISPLAY PANEL AND DISPLAY APPARATUS

(71) Applicant: Xiamen Tianma Display Technology Co., Ltd., Xiamen (CN)

(72) Inventor: Dandan Zang, Xiamen (CN)

(73) Assignee: XIAMEN TIANMA DISPLAY TECHNOLOGY CO., LTD., Xiamen (CN)

( * ) Notice: Subject to any disclaimer, the term of this patent is extended or adjusted under 35 U.S.C. 154(b) by 490 days.

(21) Appl. No.: 18/077,208

(22) Filed: Dec. 7, 2022

(65) Prior Publication Data

US 2024/0099090 A1    Mar. 21, 2024

(30) Foreign Application Priority Data

Sep. 20, 2022  (CN) .......................... 202211144382.6

(51) Int. Cl.
| | |
|---|---|
| *H10K 59/35* | (2023.01) |
| *H10K 50/858* | (2023.01) |
| *H10K 59/122* | (2023.01) |

(52) U.S. Cl.
CPC ......... *H10K 59/353* (2023.02); *H10K 50/858* (2023.02); *H10K 59/122* (2023.02); *H10K 59/352* (2023.02)

(58) Field of Classification Search
CPC .. H10K 59/353; H10K 50/858; H10K 59/122; H10K 59/352
See application file for complete search history.

(56) References Cited

U.S. PATENT DOCUMENTS

| | | | |
|---|---|---|---|
| 2021/0264823 A1* | 8/2021 | Heo | ...................... G09G 3/3208 |
| 2023/0217716 A1* | 7/2023 | Shen | ...................... H10K 59/122 |
| | | | 257/40 |

FOREIGN PATENT DOCUMENTS

| | | | | |
|---|---|---|---|---|
| CN | 113380854 A | | 9/2021 | |
| WO | WO-2023206127 A1 * | 11/2023 | | ........... H10K 59/122 |

OTHER PUBLICATIONS

English Machine Translation of Shi, WO 2023206127 (Year: 2025).*

* cited by examiner

*Primary Examiner* — Donald L Raleigh
(74) *Attorney, Agent, or Firm* — East IP P.C.

(57) ABSTRACT

The present application provides a display panel and a display apparatus, and the display panel includes a first light-emitting unit, pixel openings and light extraction openings, and orthographic projections of the pixel openings on the substrate are pixel projections, and orthographic projections of the light extraction openings arranged correspondingly to the pixel openings on the substrate are opening projections; in the first light-emitting unit, in the first light-emitting unit, at least a minimum distance between a first point and a second point greater than 4 microns exists, where the first point is positioned on an edge of a pixel projection of the pixel projections corresponding to the first light-emitting unit, and the second point is positioned on an edge of an opening projection of the opening projections corresponding to the first light-emitting unit. Desired display brightness of display panel at large viewing angle is ensured.

16 Claims, 12 Drawing Sheets

DISPLAY PANEL AND DISPLAY APPARATUS

CROSS-REFERENCE TO RELATED APPLICATION

This application claims priority to Chinese Patent Application No. 202211144382.6, filed on Sep. 20, 2022, which is hereby incorporated by reference in its entirety.

TECHNICAL FIELD

The present application relates to the field of display technologies, and particularly to a display panel and a display apparatus.

BACKGROUND

Compared to a liquid crystal display screen, an organic light-emitting display screen has many advantages such as being thinner and lighter, having higher brightness, lower power consumption, faster response, higher definition, better flexibility, higher light-emitting efficiency or the like, and has gradually become a mainstream display technology. A light-emitting principle of the organic light-emitting display screen is that holes generated by an anode and electrons generated by a cathode in an organic light-emitting device move under an electric field, so as to be injected into a hole transport layer and an electron transport layer respectively, and then transferred to an organic light-emitting material layer. When the holes and the electrons meet in the light-emitting material layer, energy excitons are generated to excite light-emitting molecules in the organic light-emitting material layer to generate visible light. An organic light-emitting display screen includes multiple layers of film structures with different refractive indices, so that light emitted by a pixel will be reflected and refracted in various ways and thus cannot be emitted directly above the pixel, which affects brightness of the emitted light. Moreover, light with a large angle may reach an adjacent pixel, which causes problems of color mixture.

SUMMARY

In view of this, the present application provides a display panel and a display apparatus, so as to solve a problem in the related art that brightness of a white light image under a large angle is not up to standards due to using a light extraction technology to improve a light extraction efficiency of the display panel, which effectively mitigates large viewing angle color shift due to the light extraction technology.

In a first aspect, the present application provides a display panel including: a substrate; a plurality of light-emitting units; a pixel definition layer on a side of the substrate, the pixel definition layer comprising a plurality of pixel openings each defining a respective one of the light-emitting units, the light-emitting units comprising a first light-emitting unit; a light extraction layer on a side of the pixel definition layer away from the substrate, the light extraction layer comprising a plurality of light extraction openings overlapping the pixel openings in a direction perpendicular to the substrate; a matching layer on a side of the light extraction layer away from the substrate, the matching layer having a refractive index greater than that of the light extraction layer; wherein when viewed from the direction perpendicular to the substrate, a minimum distance between a first point on an edge of a pixel opening corresponding to the first light-emitting unit and a second point on an edge of a light extraction opening corresponding to the first light-emitting unit is greater than 4 microns.

In a second aspect, the present application further provides a display apparatus comprising the display panel provided by the present application.

DETAILED DESCRIPTION

Figure 1:
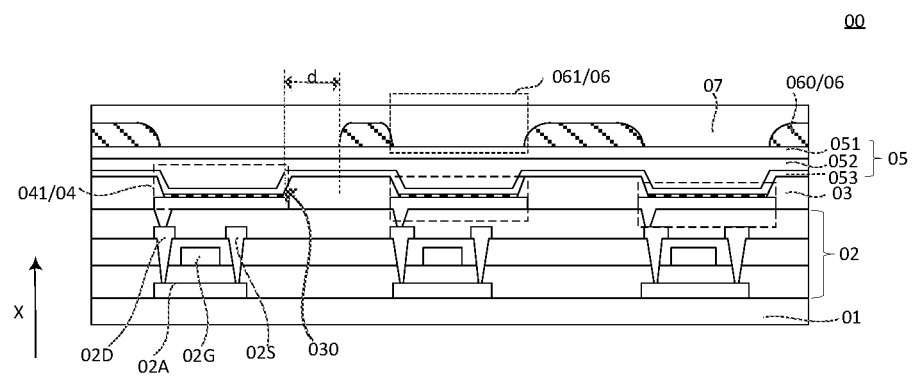
FIG. 1 is a schematic view of an optional implementation of a display panel according to an embodiment of the present application.

In order to make the above objects, features and advantages of the present application clearer and more comprehensible, the present application is further described below with reference to the accompanying drawings and embodiments.

It should be noted that specific details are described in the following description in order to understand the present application thoroughly. However, the present application can be implemented in many other ways different from those described herein, and those skilled in the art can make similar improvements without departing from concepts of the present application Accordingly, the present application is not limited by specific implementations described below. In addition, in the following description, the same reference numerals in the drawings show the same or similar structures, and thus their repeated descriptions will be omitted.

Figure 2:
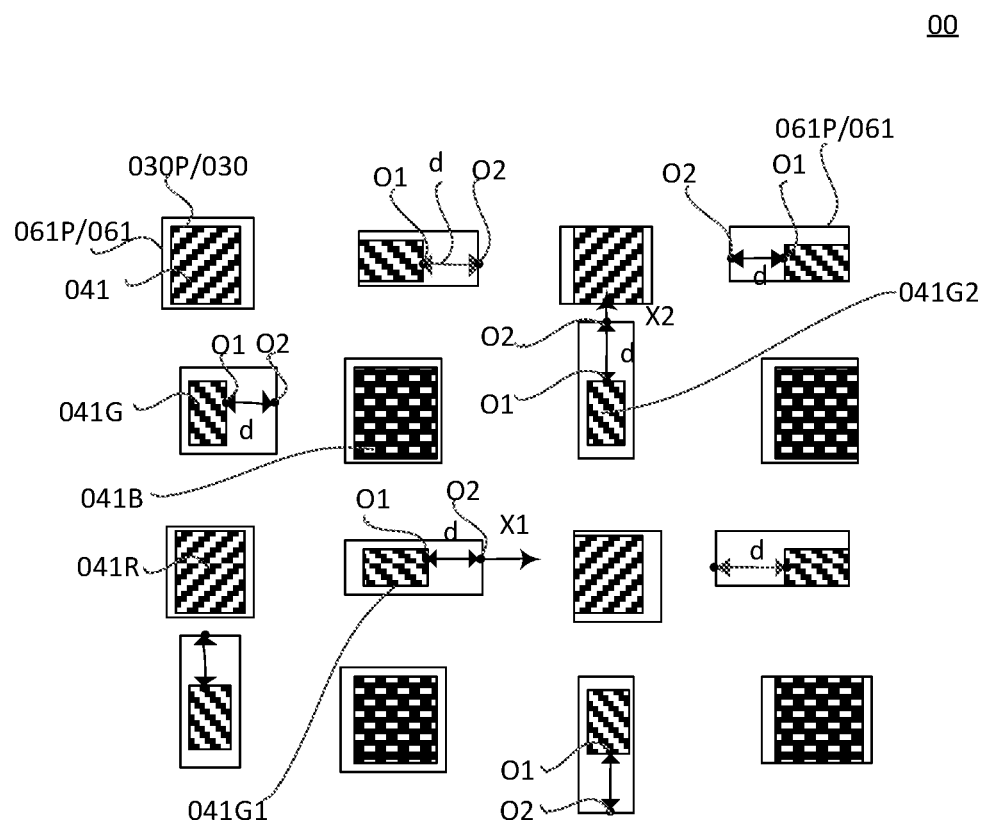
FIG. 2 is a schematic top view of an optional implementation of a display panel according to an embodiment of the present application.

FIG. 1 is a schematic view of an optional implementation of a display panel according to an embodiment of the present application. FIG. 2 is a schematic top view of an optional implementation of a display panel according to an embodiment of the present application. As shown in FIG. 1, a display panel 00 includes a substrate 01 and a pixel definition layer 03 positioned on a side of the substrate 01. The pixel definition layer 03 includes a plurality of pixel openings 030. With continuous reference to FIG. 1 and FIG. 2, the display panel 00 further includes a plurality of light-emitting units 04 each defined by a corresponding pixel opening 030, and the light-emitting units 04 include a first light-emitting unit 041. The light-emitting units 04 and the pixel openings 030 are arranged correspondingly, and one light-emitting unit 04 corresponds to one pixel opening 030.

Optionally, the display panel may further include an array layer 02 positioned between the pixel definition layer 03 and the substrate 01. The array layer 02 includes a plurality of thin film transistors. The thin film transistor includes a source/drain 02S/02D, a gate 02G and an active layer 02A. This application only illustrates the technical solution in which there is one thin film transistor. It should be understood that there may be any number of thin film transistors, and the specific number may be set according to specific requirements of the display panel, which is not specifically limited in the embodiments.

Optionally, the light-emitting unit 04 includes an anode, a light-emitting material layer and a cathode. A material of the anode includes ITO/Ag/ITO, and a material of the cathode includes magnesium-silver alloy. In an embodiment of the present application, an organic light-emitting diode (OLED) may be selected for forming the light-emitting unit 04 mentioned above. Alternatively, the light-emitting unit 04 may be provided as a micro light emitting diode (Micro-LED) or a quantum dot light emitting diode (QLED).

With reference to FIG. 1, the display panel 00 further includes a light extraction layer 06 positioned on a side of the pixel definition layer 03 away from the substrate 01. The light extraction layer 06 includes a plurality of light extraction openings 061. The light extraction opening 061 is overlapped with a corresponding pixel opening 030 along a direction X perpendicular to the substrate. Orthographic projections of the pixel openings 030 on the substrate 01 are pixel projections 030P, and orthographic projections of the light extraction openings 061 arranged correspondingly to the pixel openings 030 on the substrate 01 are opening projections 061P. It should be understood that a certain light-emitting unit 04 is defined by a pixel opening 030, and a light extraction opening 061 corresponding to the light-emitting unit 04 is a light extraction opening 061 arranged correspondingly to the pixel opening 030. With reference to FIG. 1 and FIG. 2, in the first light-emitting unit 041, a minimum distance between a first point O1 and a second point O2 greater than 4 microns exists. The first point O1 is positioned on an edge of a pixel projection 030P corresponding to the first light-emitting unit 041, and the second point O2 is positioned on an edge of an opening projection 061P corresponding to the first light-emitting unit 041. A minimum distance between an orthographic projection of the edge of the pixel opening 030 corresponding to the first light-emitting unit 041 and the edge of the light extraction opening 061 corresponding to the first light-emitting unit 041 on the substrate is d, and d>4 µm. That is, a minimum distance d between the first point O1 and the second point O2 greater than 4 microns exists, which means that in the first light-emitting unit 041, the minimum distance between the edge of the pixel projection 030P and the edge of the opening projection 061P is greater than 4 microns. The light extraction opening 061 corresponding to the first light-emitting unit 041 is set large, so that at least one edge of a light extraction structure 060 of the light extraction layer 06 is away from the first light-emitting unit 041. A light extraction efficiency of the light extraction structure 060 for the first light-emitting unit 041 at this position can be reduced, and it can be ensured that a part of large viewing angle light on a certain edge of the first light-emitting unit 041 does not completely disappear, which ensures desired brightness of a large viewing angle image under a certain viewing angle. First, a desired light-emitting efficiency of the display panel at a front viewing angle can be ensured, the brightness of the display panel can be increased and power consumption can be reduced; second, it can be ensured that large viewing angle light of the display panel is not completely converted, and desired display brightness of the display panel at a large viewing angle is ensured.

Optionally, the display panel 00 further includes a thin film package layer 05 positioned between a light modulation structure and the light-emitting unit 04. Optionally, the thin film package layer 05 may include one, two, three or more layers of film layers, and the thin film package layer 05 may include an organic layer 052 and an inorganic layer 501/503 that are arranged alternately. In the display panel provided by the embodiments, the substrate 01 is a flexible substrate having a property of being bendable. Optionally, the thin film package layer 05 has good bendability. The display panel provided by the embodiments may be bent and folded. Specific material and film layer structure of the thin film package layer 05 are not specifically limited in the embodiments.

As shown in FIG. 2, several shape arrangements of the light extraction opening 061 and the first light-emitting unit 041 are shown in the FIG. 1. In the first light-emitting unit 041, an area of the light extraction opening 061 is greater than or equal to an area of the pixel opening 030, or along a direction perpendicular to the substrate, an edge of the light extraction opening 061 is overlapped with one edge of the pixel opening 030, the relative position and size of the light extraction openings and the pixel openings are not limited in the embodiments.

Optionally, a color of light emitted by the first light-emitting unit 041 is green, that is, the first light-emitting unit 041 emits green light. Through research, the inventor has found that, in a display panel provided with a light extraction layer, when a white image is being displayed, brightness of the display panel at a viewing angle of 30° is lower than brightness of the display panel at a front viewing angle by 65%, resulting in a phenomenon that the brightness at a viewing angle under the white image is not up to standards. Besides, generally, green pixels accounts for 70% of pixels under a white image and a pixel size corresponding to a green light-emitting unit is the smallest, and a light extraction layer corresponding to the green light-emitting unit has the greatest enhancement of luminous efficiency of the light emitting unit, thus attenuation at a large viewing angle corresponding to the green light-emitting unit is relatively fast, and therefore color shift at a large viewing angle exists under the white image. For a pixel with the relatively fast attenuation at a large viewing angle, and for the green pixel unit, a light extraction effect of a certain side of the light extraction structure corresponding to the green light-emitting unit is reduced or eliminated, so that desired light extraction effect of the light extraction structure can be ensured, and on a basis of not affecting an light-emitting effect at a front viewing angle, significant brightness attenuation at a viewing angle can be avoided, so as to avoid causing a color shift difference in azimuth.

It should be noted that, the embodiments are set forth in with a principle that the pixel size of the green light-emitting unit is the smallest and the green light-emitting unit has the fastest viewing angle attenuation. If, for a light-emitting unit of a certain color, severe attenuation at a large viewing angle is caused by a light-emitting material, a material of the light extraction layer or other designs, the light-emitting unit in such situation may be light-emitting units of other colors, which will not be detailed in the present application.

Optionally, the first light-emitting unit includes a first sub-light-emitting unit and a second sub-light-emitting unit emitting light of a same color as the first sub-light-emitting unit. A direction from the first point to the second point in the first sub-light-emitting unit is a first direction, and a direction from the first point to the second point in the second sub-light-emitting unit is a second direction. The first direction and the second direction are different directions.

Figure 3:
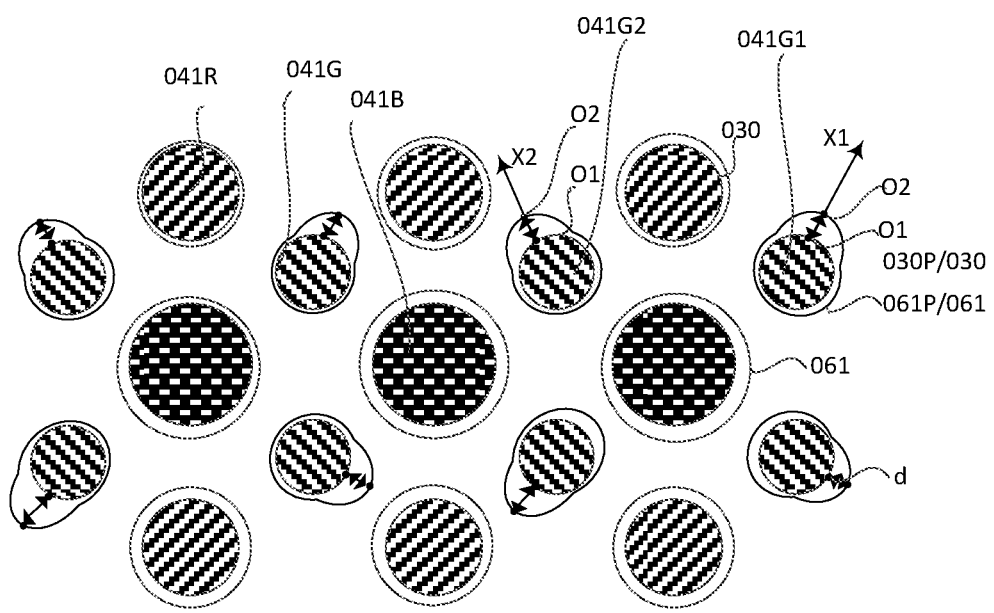
FIG. 3 is a schematic top view of another optional implementation of a display panel according to an embodiment of the present application.

FIG. 3 is a schematic top view of another optional implementation of a display panel according to an embodiment of the present application. As shown in FIG. 2 and FIG. 3, the first light-emitting unit 041 includes a first sub-light-emitting unit 041G1 and a second sub-light-emitting unit 041G2 emitting light of a same color as the first sub-light-emitting unit 041G1. A direction from the first point O1 to the second point O2 in the first sub-light-emitting unit 041G1 is a first direction X1, and a direction from the first point O1 to the second point O2 in the second sub-light-emitting unit 041G2 is a second direction X2. The first direction X1 and the second direction X2 are different directions. The first direction X1 and the second direction X2 being different directions means that, for light-emitting units of a same color, an arrangement in which light extraction for the first sub-light-emitting unit 041G1 by the light extraction structure along the first direction X1 is weakened exists, and an arrangement in which light extraction for the second sub-light-emitting unit 041G2 by the light extraction structure along the second direction X2 different form the first direction X1 is weakened also exists, so that desired large viewing angle brightness can be ensured from multiple directions, and an enhancement for a viewing angle along a single direction, which affects display effects at other viewing angles and is adverse to display effect of the display panel, can be avoided.

Optionally, as shown in FIG. 2 and FIG. 3, the light-emitting units may include a blue light-emitting unit 041B, a green light-emitting unit 041G, and a red light-emitting unit 041R. Different pixel arrangements are illustrated in an exemplified way in FIG. 2 and FIG. 3, respectively, and specific pixel arrangements of the display panel are not limited.

Optionally, a distance between the first point and the second point in the first sub-light-emitting unit is D1, a distance between the first point and the second point in the second sub-light-emitting unit is D2, the first direction is opposite to the second direction, and D1=D2.

Figure 4:
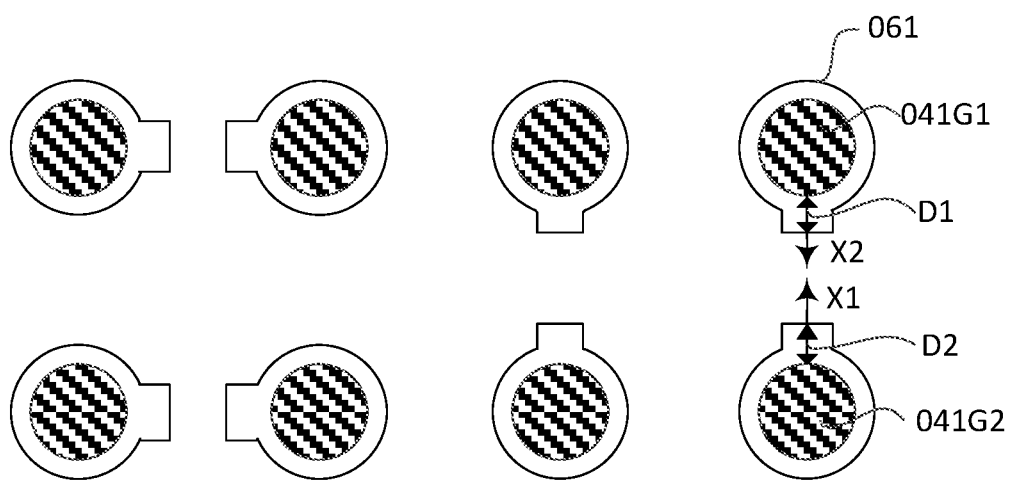
FIG. 4 is a schematic top view of another optional implementation of a display panel according to an embodiment of the present application.

FIG. 4 is a schematic top view of another optional implementation of the display panel according to an embodiment of the present application. As shown in FIG. 4, the distance between the first point O1 and the second point O2 in the first sub-light-emitting unit 041G1 is D1, the distance between the first point O1 and the second point O2 in the second sub-light-emitting unit 041G2 is D2, the first direction X1 is opposite to the second direction X2, and D1=D2. In the embodiments, improvement is made for two opposite viewing angles, and distance arrangements of the light extraction structures for the two opposite viewing angles are set the same, that is, D1=D2, so as to ensure that along the opposite first direction X1 and second direction X2, the light extraction structures have approximately same light extraction effects on the light-emitting units, that is, the viewing angle brightness attenuations are similar and the large viewing angle light is retained to a similar degree. Concentrated enhancement of the large viewing angle light along a certain direction can be avoided, and the enhancement for a viewing angle along a single direction, which affects display effects at other viewing angles, can be avoided, thus optimizing the display effect.

Optionally, the first sub light-emitting unit 041G1 and the second sub light-emitting unit 041G2 are arranged alternately. The concentrated enhancement of the large viewing angle light along the certain direction is avoided. The large viewing angle light are set to be enhanced alternately along different directions, a concentrated occurrence of display brightness difference at a certain position of white image at large viewing angle is avoided, and the display effect is optimized.

Optionally, the light-emitting unit further includes a second light-emitting unit. In the second light-emitting unit, a distance between an edge of the pixel projection and an edge of the corresponding opening projection is less than 2.5 microns; and at least one second light-emitting unit is included between two first light-emitting units of a same color.

Figure 5:
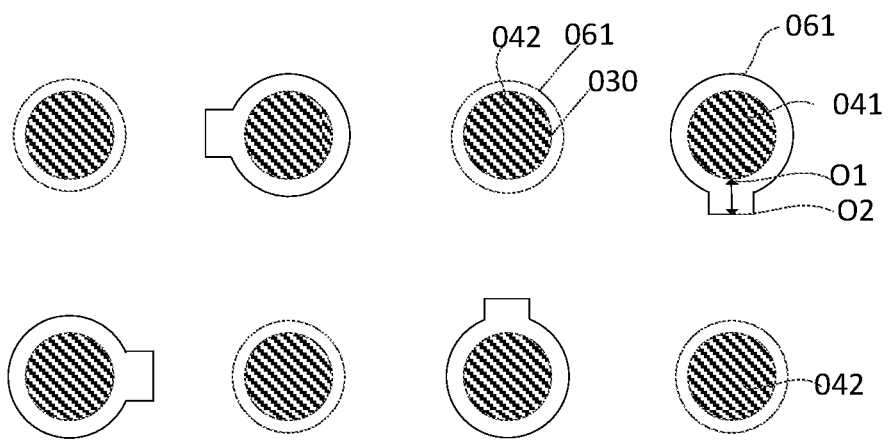
FIG. 5 is a schematic top view of another optional implementation of a display panel according to an embodiment of the present application.

FIG. 5 is a schematic top view of another optional implementation of the display panel according to an embodiment of the present application. As shown in FIG. 5, the light-emitting unit includes a second light-emitting unit 042. In the second light-emitting unit, the distance between the edge of the pixel projection 061P and the edge of the corresponding opening projection 030P is less than 2.5 microns. Optionally, the distance between the edge of the pixel projection 061P and the edge of the corresponding opening projection 030P may be zero. At least one second light-emitting unit 042 is included between the two first light-emitting units 041 of the same color. In the second light-emitting unit 042, the distance between the edge of the pixel projection 061P and the edge of the corresponding opening projection 030P is less than 2.5 microns, that is, the light extraction structure has a strong light extraction effect on each edge of the second light-emitting unit 042. At least one second light-emitting unit 042 is included between two first light-emitting units 041 of a same color, which ensures existence of at least one second light-emitting unit 042 with normal light extraction between the first light-emitting units 041 with a weakened light extraction efficiency along a certain direction, so that uniformity of the front viewing angle light can be ensured to the greatest extent and the display effect can be optimized. Optionally, the first light-emitting unit 041 and the second light-emitting unit 042 emit the light of the same color. Optionally, as shown in FIG. 5, the first light-emitting unit 041 and the second light-emitting unit 042 are arranged alternately.

Optionally, the first light-emitting unit further includes a minimum distance between a third point and a fourth point greater than 4 microns. The third point is positioned on the edge of the pixel projection corresponding to the first light-emitting unit and the fourth point is positioned on the edge of the opening projection corresponding to the first light-emitting unit. A direction from the first point to the second point is a first direction, a direction from the third point to the fourth point is a second direction, and the first direction is opposite to the second direction.

Figure 6:
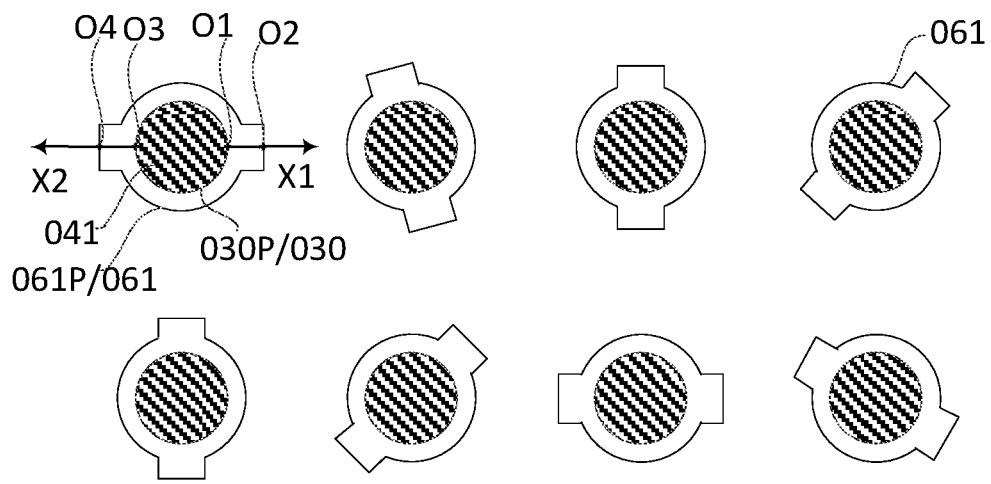
FIG. 6 is a schematic top view of another optional implementation of a display panel according to an embodiment of the present application.

FIG. 6 is a schematic top view of another optional implementation of the display panel according to an embodiment of the present application. As shown in FIG. 6, the first light-emitting unit 041 further includes a minimum distance between a third point O3 and a fourth point O4 greater than 4 microns. The third point O3 is positioned on the edge of the pixel projection 030P corresponding to the first light-emitting unit 041, and the fourth point O4 is positioned on the edge of the opening projection 061P corresponding to the first light-emitting unit 041. A direction from the first point O1 to the second point O2 is a first direction X1, a direction from the third point O3 to the fourth point O4 is a second direction X2, and the first direction X1 is opposite to the second direction X2. Compared to the previous embodiments, in this embodiment, adjustment of light extraction efficiencies along different directions is achieved in a same first light-emitting unit, so that a viewing angle at which the light is emitted out can be adjusted with maximum precision and display uniformity can be ensured.

Optionally, a same one of the light extraction openings is overlapped with at least two of the pixel openings along the direction perpendicular to the substrate.

Figure 7:
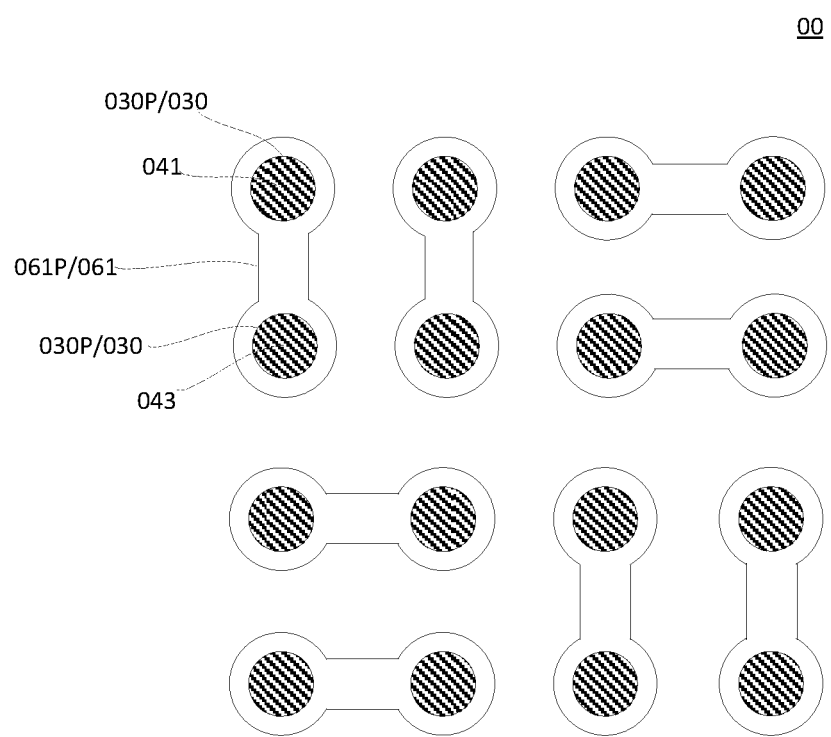
FIG. 7 is a schematic top view of another optional implementation of a display panel according to an embodiment of the present application.
Figure 8:
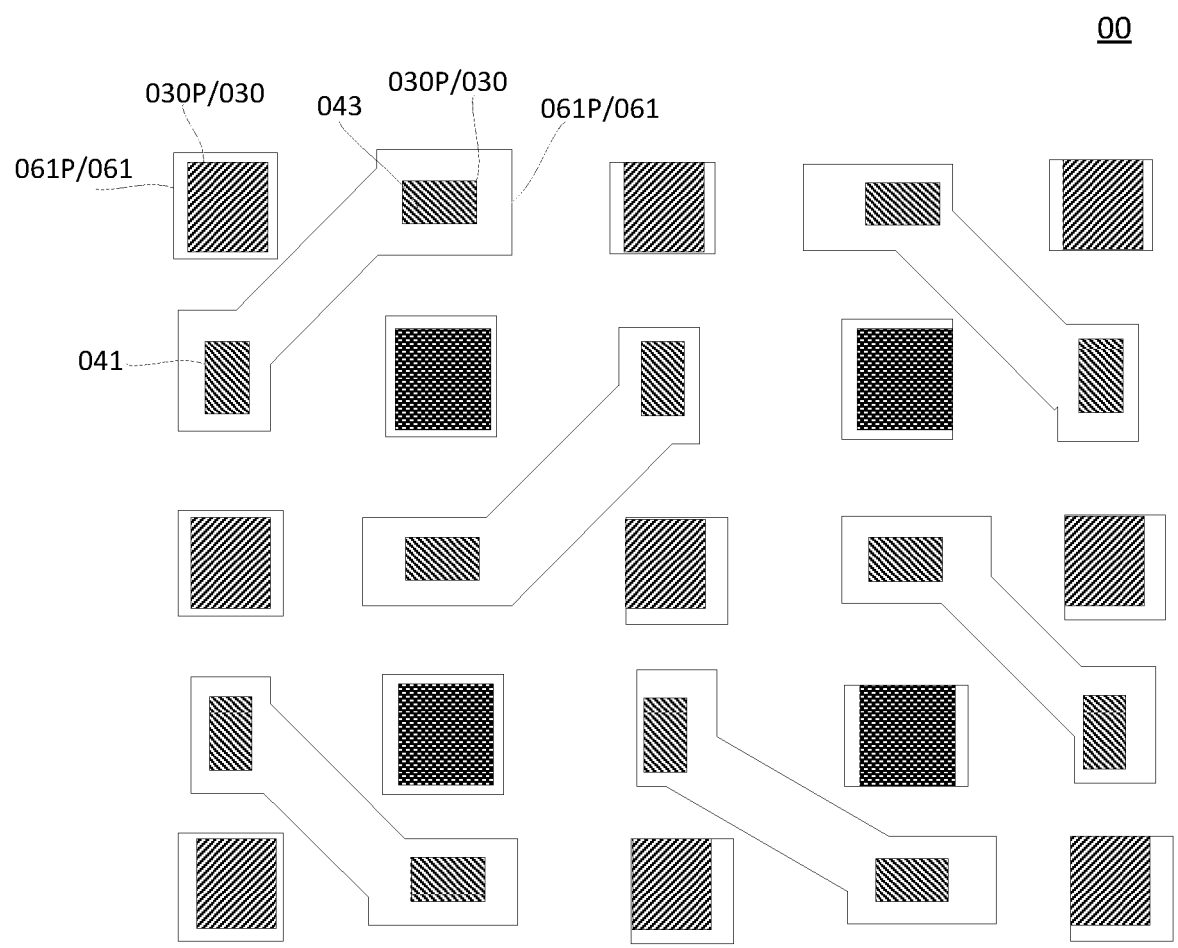
FIG. 8 is a schematic top view of another optional implementation of a display panel according to an embodiment of the present application.

FIG. 7 is a schematic top view of another optional implementation of a display panel according to an embodiment of the present application. FIG. 8 is a schematic top view of another optional implementation of a display panel according to an embodiment of the present application. As shown in FIG. 7 and FIG. 8, a same one of the light extraction openings 061 is overlapped with at least two of the pixel openings 030 along the direction perpendicular to the substrate, it can be understood in other words that one light extraction opening 061 are arranged correspondingly to two pixel openings 030, that is, one light extraction opening 061 are arranged correspondingly to two first light-emitting units 041. Through further research, the applicant has found that, when a distance between a boundary of the light extraction structure and the pixel opening (that is, the light-emitting unit) increases, the luminous efficiency decreases and a viewing angle increases. However, for a product with high PPI, the distance between pixels (light-emitting units) is limited, and lateral span of a gradient angle of the light extraction structure parallel to the substrate is about 3 microns. After the distance arrangement between the light extraction opening and the pixel opening gradually increases, the distance between two adjacent light-emitting units is limited, lateral span space of the gradient angle of the light extraction structure is compressed, so that the gradient angle of the light extraction structure fails to meet light extraction requirements, and thus directly affects the light emitting effect. In this embodiment, two first light-emitting units 041 are arranged correspondingly to one light extraction opening 061. First, at least one edge of the light extraction structure 060 of the light extraction layer 06 is away from the first light-emitting unit 041, so that the light extraction efficiency for the first light-emitting unit 041 by the light extraction structure 060 can be reduced on a certain boundary, it can be ensured that a part of the viewing angle light on a certain edge of the first light-emitting unit 041 does not completely disappear, desired image brightness at a certain large viewing angle can be ensured, and the light extraction openings 061 corresponding to the two pixel openings can be in communication, so that at least one edge of the first light-emitting unit has no luminous efficiency increase, thereby the viewing angle brightness attenuation is improved. Second, in this embodiment, it is not necessary to deliberately keep a boundary of a certain light extraction opening 061 away from a boundary of the pixel opening 030, which not only can ensure that the gradient angle of the light extraction structure ensures desired light emitting efficiency, but also can ensure desired PPI of the display panel.

Optionally, the light-emitting units include a third light-emitting unit. The first light-emitting unit and the third light-emitting unit are overlapped with a same light extraction opening. The light emitted by the first light-emitting unit and light emitted by the third light-emitting unit are of a same color. As shown in FIG. 7 and FIG. 8, the light-emitting units include a third light-emitting unit 043. The first light-emitting unit 041 and the third light-emitting unit 043 are overlapped with a light extraction opening 061. The light emitted by the first light-emitting unit 041 and the light emitted by the third light-emitting unit 043 are of a same color. It can be understood that, the first light-emitting unit 041 and the third light-emitting unit 043 are arranged correspondingly to one light extraction opening 061, and the light emitted by the first light-emitting unit 041 and the light emitted by the third light-emitting unit 043 are of the same color. The light-emitting units of the same color are correspondingly arranged in a same light extraction opening, so that an occurrence of a phenomenon of color mixture in light-emitting units of different colors can be avoided, and it is not necessary to deliberately keep the boundary of a certain light extraction opening 061 away from the boundary of the pixel opening 030, which can ensure that the gradient angle of the light extraction structure ensures desired light emitting efficiency.

Figure 9:
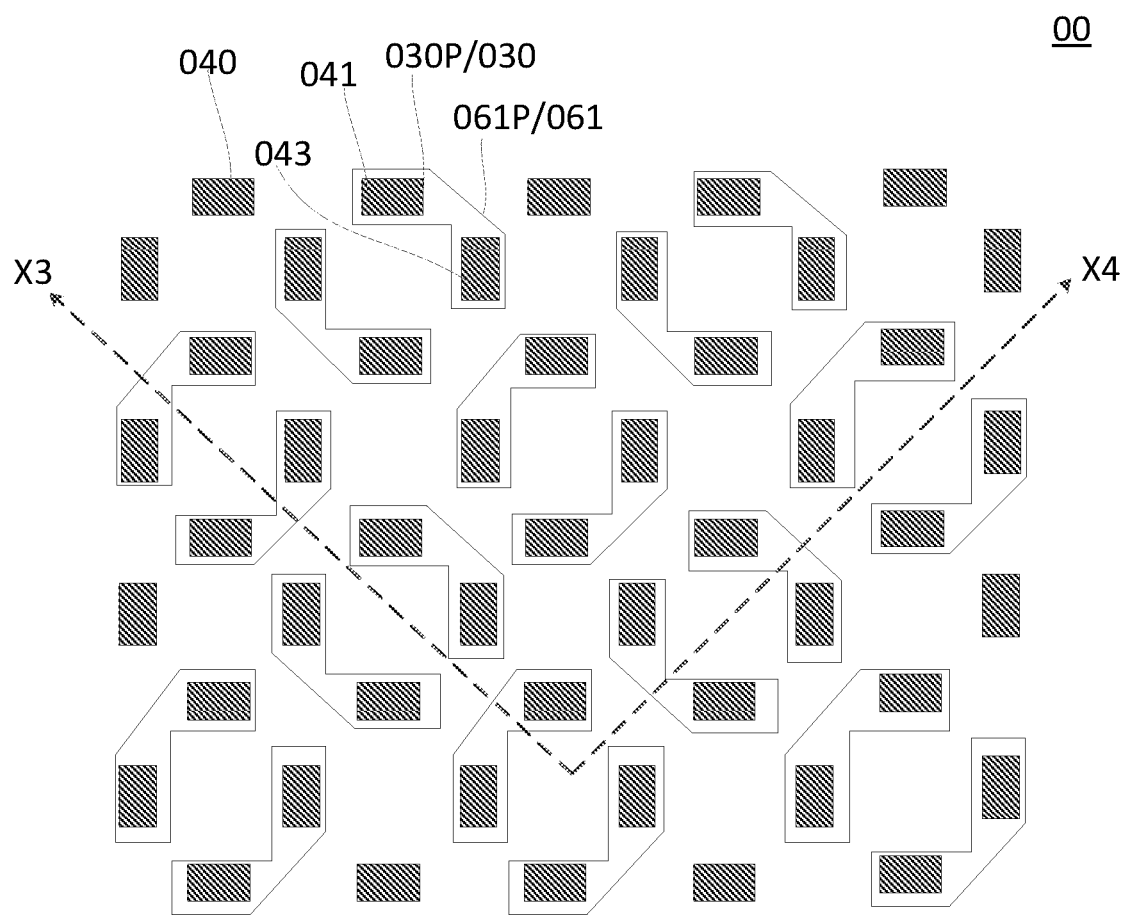
FIG. 9 is a schematic top view of another optional implementation of a display panel according to an embodiment of the present application.

Optionally, the light-emitting unit includes sub-light-emitting units of a same color arranged in a matrix. Along a row direction or a column direction, a sub-light-emitting unit on a $(m+1)^{th}$ row and a $(n+1)^{th}$ column is positioned between a sub-light-emitting unit on a $m^{th}$ row and a nth column and a sub-light-emitting unit on the $m^{th}$ row and the $(n+1)^{th}$ column; m>0, n>0, and m and n are positive integers; the first light-emitting unit is a sub-light-emitting unit on the $m^{th}$ column, and the third light-emitting unit is a sub-light-emitting unit on the $(m+1)^{th}$ column. FIG. 9 is a schematic top view of another optional implementation of the display panel according to an embodiment of the present application. As shown in FIG. 9, the light-emitting unit includes sub-light-emitting units 040 of a same color arranged in a matrix. Along a row direction or a column direction, a sub-light-emitting unit 040 on a $(m+1)^{th}$ row and a $(n+1)^{th}$ column is positioned between a sub-light-emitting unit 040 on a $m^{th}$ row and a nth column and a sub-light-emitting unit 040 on the $m^{th}$ row and the $(n+1)^{th}$ column, that is, the two adjacent rows of sub-light-emitting units 040 are arranged in a staggered manner. The first light-emitting unit 041 is a sub-light-emitting unit 040 on the $m^{th}$ column, and the third light-emitting unit 043 is a sub-light-emitting unit 040 on the $(m+1)^{th}$ column, that is, the first sub light-emitting unit 041 and the third sub light-emitting unit 043 sharing a same light extraction opening 061 are positioned on different rows. By arranging the first sub light-emitting unit 041 and the third sub light-emitting unit 043 sharing the same light extraction opening 061 to be positioned on the different rows, first, the light extraction opening are shared by the light-emitting units in different rows, which can ensure that the light extraction opening avoids to be adjacent to light-emitting units of different colors, and an influence on the light extraction effect for other light-emitting unit is avoided, and at the same time, the sub-light-emitting units 040 on the $m^{th}$ column and the sub-light-emitting units 040 on the $(m+1)^{th}$ column correspond to one light extraction opening 061, and closest sub-light-emitting units emitting light of a same color correspond to one light extraction opening 061, which is easy to implement and saves process costs.

Optionally, a sub-light-emitting unit on the $(m+1)^{th}$ row and a $P^{th}$ column and a sub-light-emitting unit on the $m^{th}$ row and a $(P-1)^{th}$ column correspond to a same one of the light extraction units, and a sub-light-emitting unit on the $(m+1)^{th}$ row and a $Q^{th}$ column and a sub-light-emitting unit on the $(m+1)^{th}$ row and a $K^{th}$ column correspond to a same one of light extraction units; where P>2, Q>2, P and Q are positive integers, and K=Q±1. With continuous reference to FIG. 9, a sub-light-emitting unit 040 on the $(m+1)^{th}$ row and a $P^{th}$ column and a sub-light-emitting unit 040 on the $m^{th}$ row and a $(P-1)^{th}$ column correspond to a same one of the light extraction units 061, and a sub-light-emitting unit 040 on the $(m+1)^{th}$ row and a $Q^{th}$ column and a sub-light-emitting unit 040 on the $(m+1)^{th}$ row and a $K^{th}$ column correspond to a same one of light extraction units 061; where P>2, Q>2, P and Q are positive integers, and K=Q±1. Compared to the previous embodiments, in this embodiment, it can be further ensured that the light extraction structure 060 and the light extraction opening 061 are arranged alternately along a 135° viewing angle direction Y1 and along 45° viewing angle direction Y2, so as to ensure uniformity of the light extraction efficiency at a certain specific viewing angle and ensure desired light emitting efficiency while optimizing the display at a viewing angle. Optionally, Q=P+4, and four rows of sub-light-emitting units are seen as one repeating cycle, which facilitates patterning of the light extraction layer 06 and saves process costs.

Figure 10:
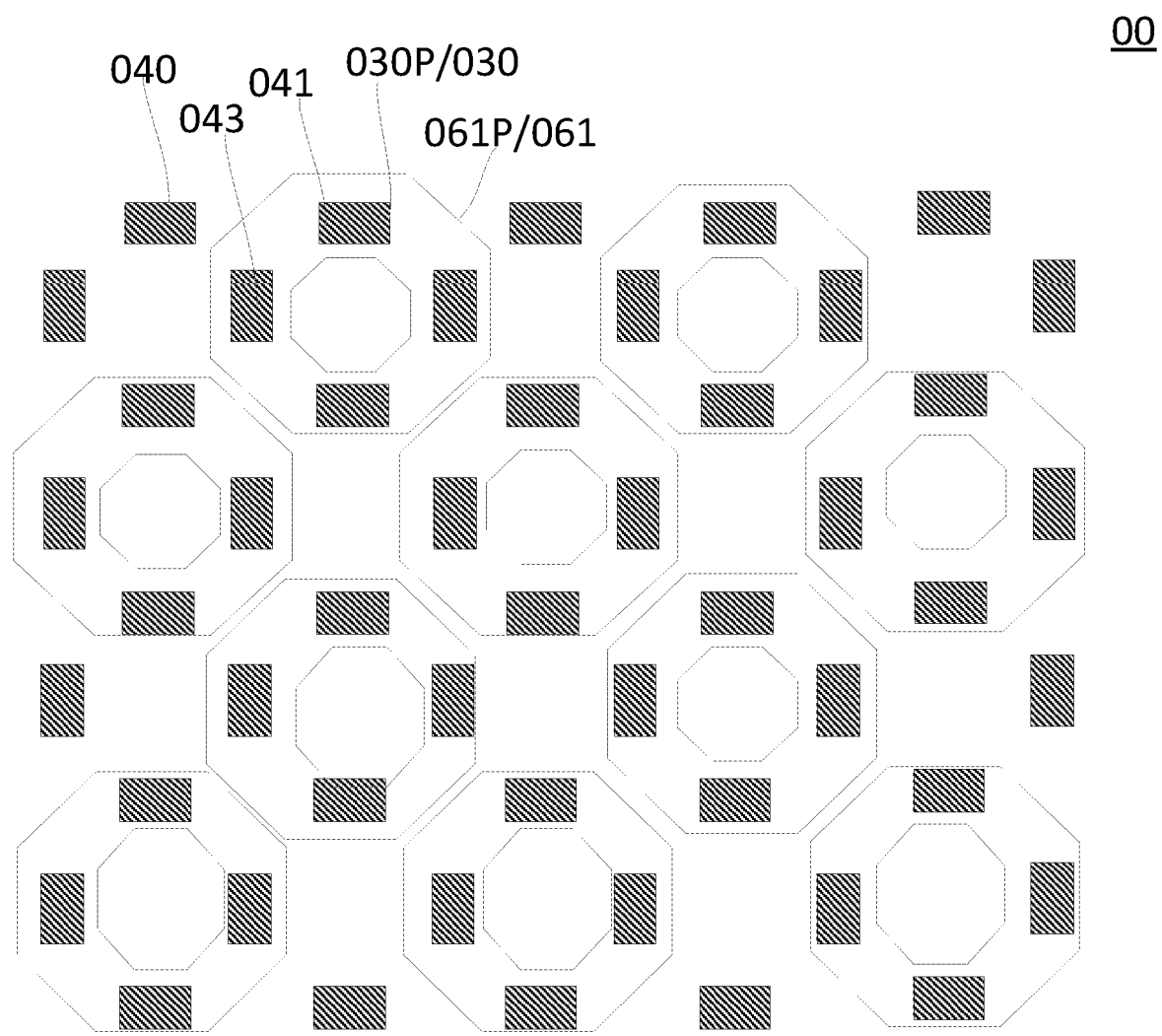
FIG. 10 is a schematic top view of another optional implementation of a display panel according to an embodiment of the present application.
Figure 11:
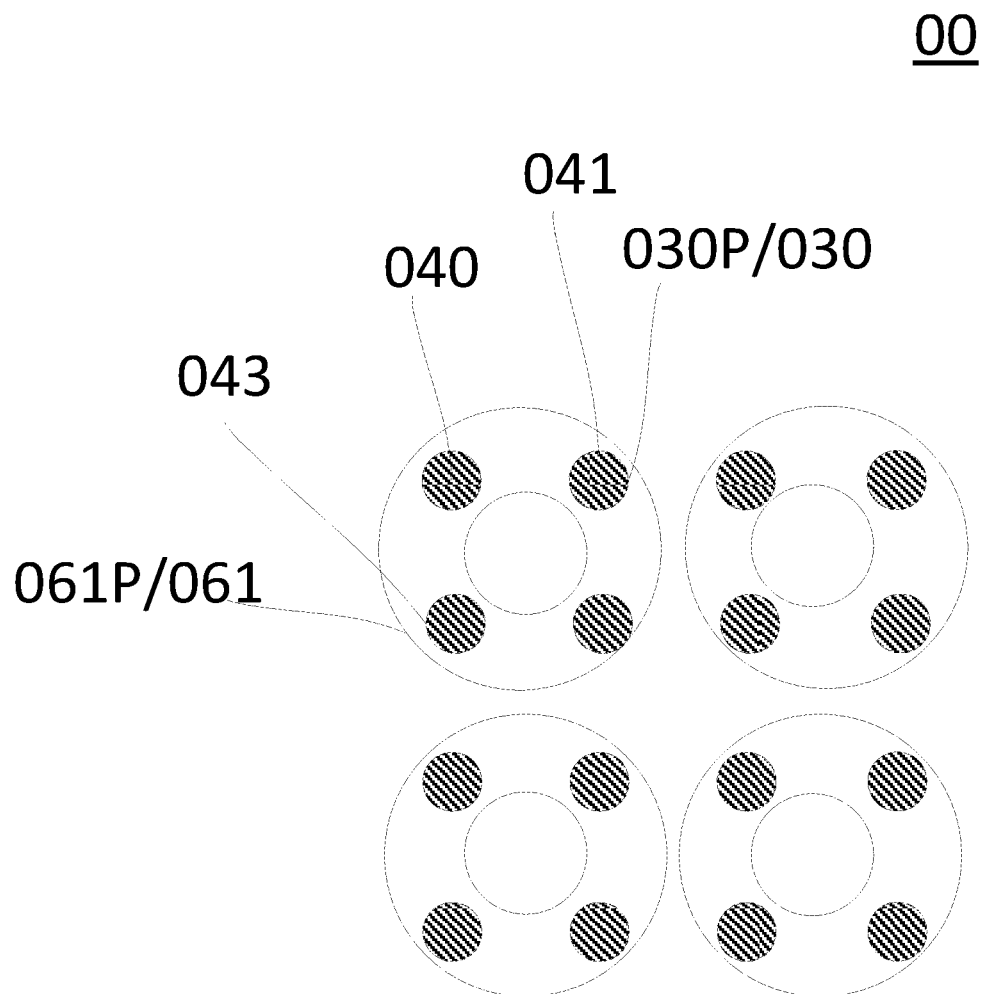
FIG. 11 is a schematic top view of another optional implementation of a display panel according to an embodiment of the present application.

Optionally, the light extraction openings are annular openings. FIG. 10 is a schematic top view of another optional implementation of the display panel according to an embodiment of the present application. FIG. 11 is a schematic top view of another optional implementation of the display panel according to an embodiment of the present application. As shown in FIG. 10 and FIG. 11, the light-emitting units 040 include a third light-emitting unit 043 and a first light-emitting unit 041, the light emitted by the first light-emitting unit 041 and the light emitted by the third light-emitting unit 043 are of the same color, and a plurality of first light-emitting units 041 and a plurality of third light-emitting units 043 are overlapped with a same light extraction opening 030. Furthermore, the light extraction openings 061 are annular openings, and a same annular light extraction opening is arranged correspondingly to a plurality of first light-emitting units 041 and a plurality of third light-emitting units 043, so that it can be ensured that a part of the light rays of a certain edge of the first light-emitting unit 041 at a viewing angle do not completely disappear, desired image brightness at a certain large viewing angle can be ensured, and the light extraction openings 061 corresponding to the two pixel openings can be in communication; so that the luminous efficiency of at least one edge of the first light-emitting unit is not improved, thereby the brightness attenuation at a viewing angle is mitigated; on the other hand, in this embodiment, it is not necessary to deliberately keep a boundary of a certain light extraction opening 061 away from a boundary of the pixel opening 030, which not only can ensure that the gradient angle of the light extraction structure ensures the light emitting efficiency, but also can ensure desired PPI of the display panel.

Optionally, the light extraction opening includes a first sub-light extraction opening, a second sub-light extraction opening and a connection opening, the first sub-light extraction opening is overlapped with the first light-emitting unit, the second sub-light extraction opening is overlapped with the third light-emitting unit, and the connection opening connects the first light extraction opening to the second light extraction opening; along the third direction, a width of the connection opening is less than a width of the first light extraction opening and a width of the second light extraction opening, and the third direction is perpendicular to a direction from the first light-emitting unit to the third light-emitting unit.

Figure 12:
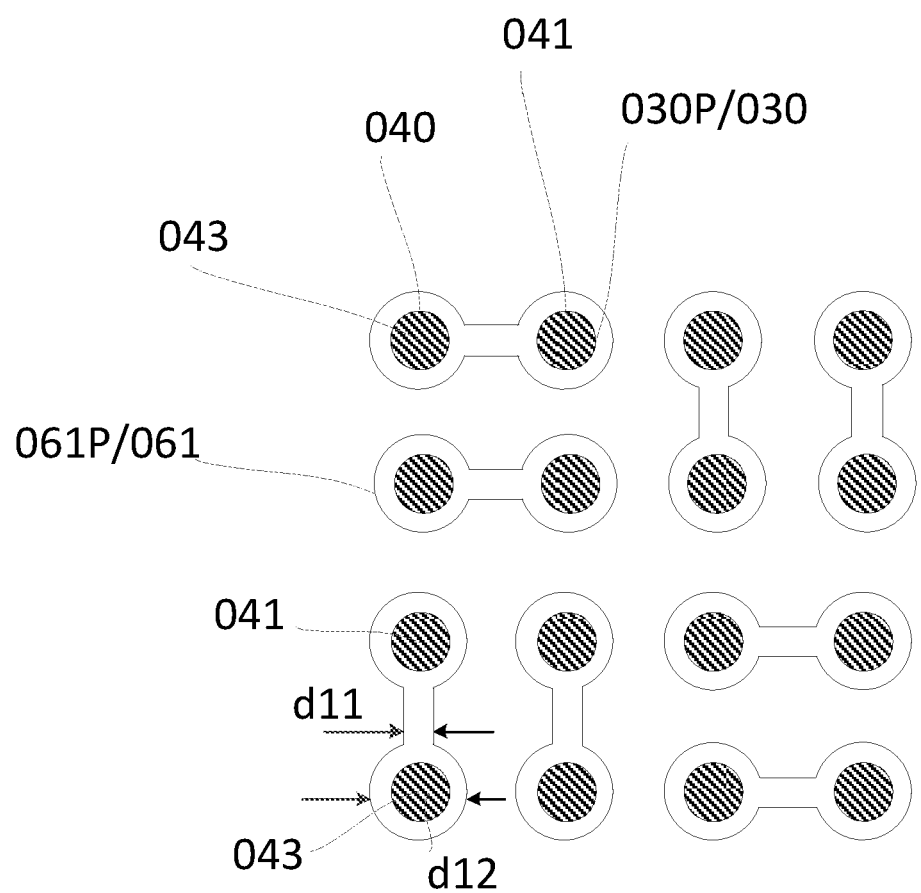
FIG. 12 is a schematic top view of another optional implementation of a display panel according to an embodiment of the present application.

FIG. 12 is a schematic top view of another optional implementation of the display panel according to an embodiment of the present application. As shown in FIG. 12, the light extraction opening 061 includes a first sub-light extraction opening 0611, a second sub-light extraction opening 0612 and a connection opening 0613. The first sub-light extraction opening 0611 is overlapped with the first light-emitting unit 041. The second sub-light extraction opening 0612 is overlapped with the third light-emitting unit 043. Along the third direction, a width d11 of the connection opening 0613 is less than a width of the first light extraction opening 0611 and a width of the second light extraction opening 0612. The third direction is perpendicular to a direction from the first light-emitting unit 041 to the third light-emitting unit 043. The connection opening 0613 communicates the first light extraction opening 0611 with the second light extraction opening 0612. The width d11 of the connection opening 0613 is less than the width of the first light extraction opening 0611 and the width of the second light extraction opening 0612. The width of the connection opening 0613 is less than those of the first light extraction opening 0611 and the second light extraction opening 0612. It is avoided that an overly large width of the connection opening 0613 between the first light extraction opening 0611 and the second light extraction opening 0612 affects the light extraction effect of neighboring light-emitting units. In addition, an increased etching area of the light extraction layer will affect patterning precision of the film layer, which is adverse to planarization of the matching layer, so that influence on the display effect is avoided.

Figure 13:
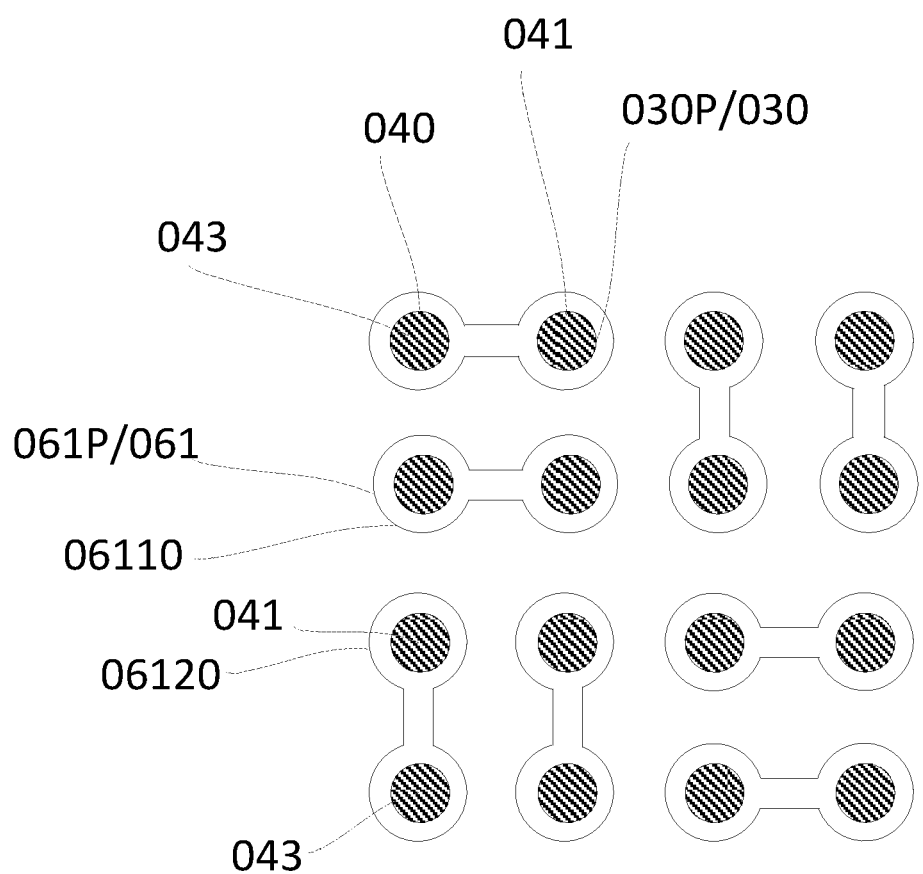
FIG. 13 is a schematic top view of another optional implementation of a display panel according to an embodiment of the present application.

FIG. 13 is a schematic top view of another optional implementation of the display panel according to an embodiment of the present application. As shown in FIG. 13, the light-emitting unit 04 includes sub-light-emitting units 040 of a same color arranged in a matrix. Adjacent two of the sub-light-emitting units 040 (such as, the first light-emitting unit 041 and the third light-emitting unit 043) correspond to a same light extraction opening 061. The light extraction openings 061 include a first sub-light extraction opening 06110 and a second sub-light extraction opening 06120. Along the direction perpendicular to the substrate, the first sub-light extraction opening 06110 is overlapped with different rows of the sub-light-emitting units 040, and the second sub-light extraction opening 06120 is overlapped with different columns of the sub-light-emitting units 040. That is to say, the first sub-light extraction opening 06110 belongs to one type of light extraction opening and is arranged correspondingly to sub-light-emitting units in different rows, the second sub-light extraction opening 06120 belongs to another type of light extraction opening and is arranged correspondingly to sub-light-emitting units in different columns. An extension direction of the first sub-light extraction opening 06110 is different from an extension direction of the second sub-light extraction opening 06120. It is avoided that the concentrated enhancement of the large viewing angle light along a certain direction, and it is avoided that the concentrated occurrence of display brightness difference in a certain position of white image at large viewing angle. Viewing angles along various directions are balanced and the display effect is optimized.

Optionally, the first sub-light extraction opening 06110 has the same shape as the second sub-light extraction opening 06120, which simplifies the process and saves costs, and the light extraction openings of the same shape extend along different directions, a light extraction opening of a non-matrix type can reduce ambient light diffraction.

Figure 14:
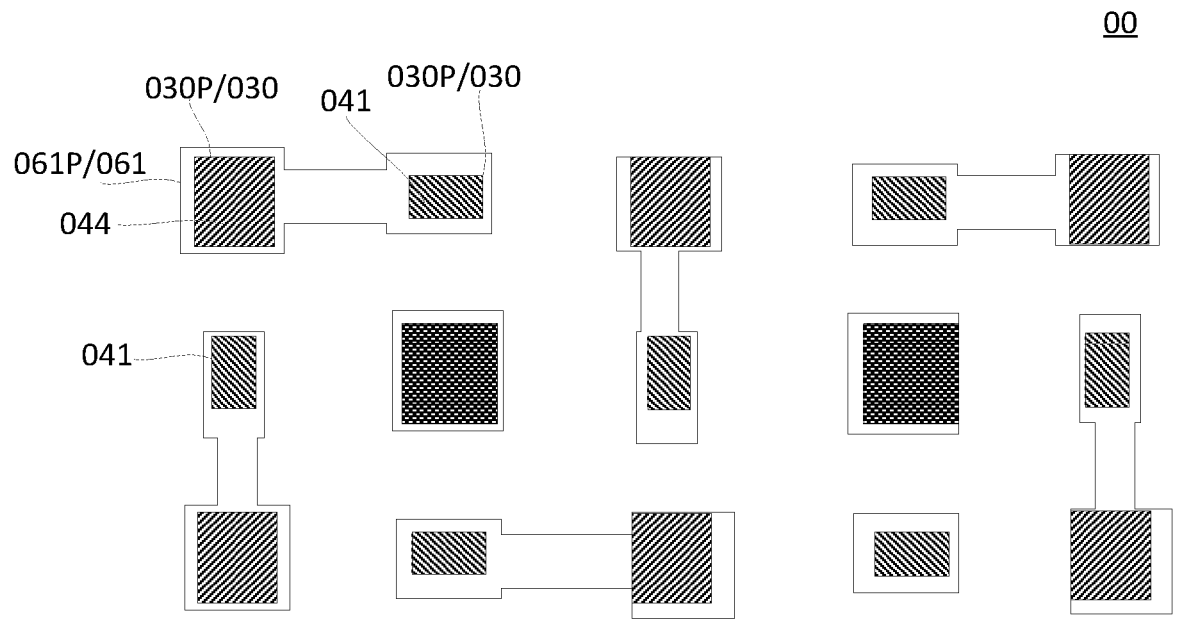
FIG. 14 is a schematic top view of another optional implementation of a display panel according to an embodiment of the present application.

Optionally, the light-emitting units include a fourth light-emitting unit. The first light-emitting unit and the fourth light-emitting unit are overlapped with a same light extraction opening. Light emitted by the first light-emitting unit and light emitted by the fourth light-emitting unit are of different colors. FIG. 14 is a schematic top view of another optional implementation of the display panel according to an embodiment of the present application. As shown in FIG. 14, the light-emitting unit 04 includes a fourth light-emitting unit 044. The first light-emitting unit 041 and the fourth light-emitting unit 044 are overlapped with a same light extraction opening 061. The light emitted by the first light-emitting unit 041 and the light emitted by the fourth light-emitting unit 044 are of different colors. By arranging two types of light-emitting units of different colors to correspond to one light extraction opening 061 at the same time, it can be ensured that viewing angle brightness of light of two colors is increased and desired PPI of the display panel is ensured at the same time. Optionally, the first light-emitting unit 041 is a green light-emitting unit and the fourth light-emitting unit 044 is a red light-emitting unit. Compared to a blue light-emitting unit, a green light-emitting unit and a red light-emitting unit have fast viewing angle attenuation. In this embodiment, the viewing angle brightness of the green light-emitting unit and the red light-emitting unit can be improved at the same time.

Figure 15:
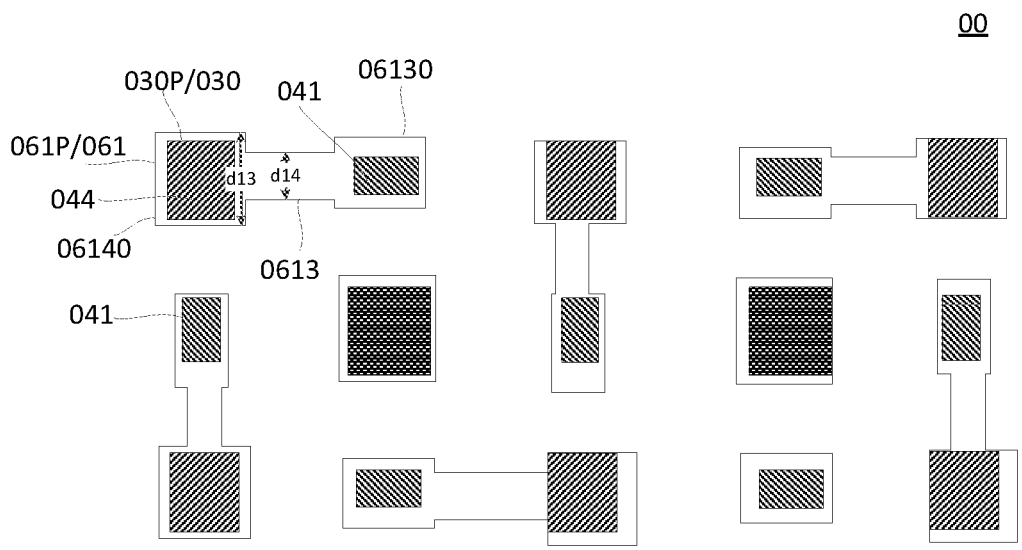
FIG. 15 is a schematic top view of another optional implementation of a display panel according to an embodiment of the present application.

Optionally, the light extraction opening includes a third sub-light extraction opening, a fourth sub-light extraction opening and a connection opening. The third sub-light extraction opening is overlapped with the first light-emitting unit. The fourth sub-light extraction opening is overlapped with the fourth light-emitting unit. The connection opening connects the third sub-light extraction opening to the fourth sub-light extraction opening. Along the third direction, a width of the connection opening is less than a width of the third sub-light extraction opening and a width of the fourth sub-light extraction opening. The third direction is perpendicular to a direction from the first light-emitting unit to the fourth light-emitting unit. FIG. 15 is a schematic top view of another optional implementation of the display panel according to an embodiment of the present application. As shown in FIG. 15, the light extraction opening 061 includes a third sub-light extraction opening 06130, a fourth sub-light extraction opening 06140 and a connection opening 0613. The third sub-light extraction opening 06130 is overlapped with the first light-emitting unit 041. The fourth sub-light extraction opening 06140 is overlapped with the fourth light-emitting unit 044. The connection opening 0613 connects the third sub-light extraction opening 06130 to the fourth sub-light extraction opening 06140. Along the third direction, a width d14 of the connection opening 0613 is less than a width of the third sub-light extraction opening 06130 and a width of the fourth sub-light extraction opening 06140. The third direction is perpendicular to a direction from the first light-emitting unit 041 to the fourth light-emitting unit 044. The width d14 of the connection opening 0613 is less than the width of the third sub-light extraction opening 06130 and the width of the fourth sub-light extraction opening 06140. It is avoided that the overly large width of the connection opening 0613 between the first light extraction opening 0611 and the second light extraction opening 0612 affects the light extraction effect of the neighboring light-emitting units. In addition, an increased etching area of the light extraction layer will affect patterning precision of the film layer, which is adverse to planarization of the matching layer, so that influence on the display effect is avoided.

Optionally, the first light-emitting unit has a smaller area than the fourth light-emitting unit, and a width of a side of the connection opening close to the first light-emitting unit is less than a width of a side of the connection opening close to the fourth light-emitting unit. The area of the first light-emitting unit 041 is less than the area of the fourth light-emitting unit. The width of the connection opening varies so that the width of the light extraction opening gradually changes, and the light extraction efficiency gradually changes, and the brightness of the display panel is more uniform.

Figure 16:
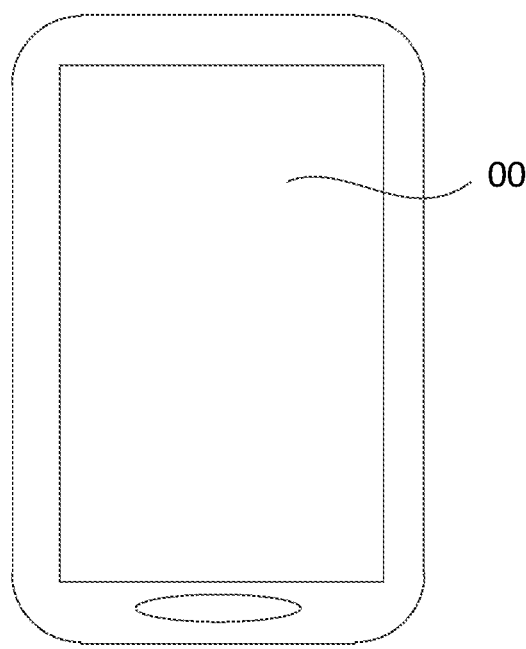
FIG. 16 is a schematic diagram of a display apparatus according to an embodiment of the present application.

The present application further provides a display apparatus. FIG. 16 is a schematic view of the display apparatus according to an embodiment of the present application. The display apparatus 000 includes the display panel 00 provided by any embodiment of the present application. The display apparatus provided by the present application includes but is not limited to: a television, a notebook computer, a desktop monitor, a tablet computer, a digital camera, a mobile phone, a smart bracelet, smart glasses, a vehicle-mounted monitor, medical equipment, industrial control equipment, a touch interaction terminal etc.

It can be seen from the embodiments above that the display panel and the display apparatus according to the present application at least achieve following beneficial effects:

In the first light-emitting unit, a minimum distance between the first point and the second point greater than 4 microns exists, that is, in the first light-emitting unit, a minimum distance between the edge of the pixel projection and the edge of the opening projection is greater than 4 microns; the light extraction opening corresponding to the first light-emitting unit is set large, so that at least one side of the light extraction structure of the light extraction layer is away from the first light-emitting unit, a light extraction efficiency of the light extraction structure for the first light-emitting unit at this position can be reduced, and it can be ensured that a part of large viewing angle light does not completely disappear, which ensures desired brightness of a large viewing angle image under a certain viewing angle. First, a desired light-emitting efficiency of the display panel at a front viewing angle can be ensured, the brightness of the display panel can be increased and power consumption can be reduced; second, it can be ensured that large viewing angle light of the display panel is not completely converted, and desired display brightness of the display panel at a large viewing angle is ensured.

The content above are further detailed descriptions of the present application in combination with specific preferred implementations, and it cannot be considered that specific implementation of the present application is limited to these descriptions. For those skilled in the art of the present application, without departing from concept of the present application, some simple deductions or substitutions can be made, which should be within protection scope of the present application.

What is claimed is:

1. A display panel, comprising:
   a substrate;
   a plurality of light-emitting units;
   a pixel definition layer on a side of the substrate, the pixel definition layer comprising a plurality of pixel openings each defining a respective one of the light-emitting units, the light-emitting units comprising a first light-emitting unit;
   a light extraction layer on a side of the pixel definition layer away from the substrate, the light extraction layer comprising a plurality of light extraction openings overlapping the pixel openings in a direction perpendicular to the substrate;
   a matching layer on a side of the light extraction layer away from the substrate, the matching layer having a refractive index greater than that of the light extraction layer;
   wherein when viewed from the direction perpendicular to the substrate, a minimum distance between a first point on an edge of a pixel opening corresponding to the first light-emitting unit and a second point on an edge of a light extraction opening corresponding to the first light-emitting unit is greater than 4 microns,
   wherein a single light extraction opening overlaps at least two of the pixel openings in the direction perpendicular to the substrate,
   wherein the light-emitting units comprise a third light-emitting unit, and the first light-emitting unit and the third light-emitting unit overlap a same light extraction opening; and the first light-emitting unit and the third light-emitting unit are to emit light of a same color,
   wherein a light extraction opening comprises a first sub-light extraction opening, a second sub-light extraction opening and a connection opening, the first sub-light extraction opening overlaps the first light-emitting unit, the second sub-light extraction opening overlaps the third light-emitting unit, and the connection opening connects the first light extraction opening to the second light extraction opening; and a width of the connection opening is less than a width of the first light extraction opening and a width of the second light extraction opening in a third direction perpendicular to a direction from the first light-emitting unit to the third light-emitting unit.

2. The display panel of claim 1, wherein
   the first light-emitting unit is to emit a green light.

3. The display panel of claim 1, wherein
   the first light-emitting unit comprises a first sub-light-emitting unit and a second sub-light-emitting unit emitting light of a same color as the first sub-light-emitting unit, and a first direction from the first point to the second point in the first sub-light-emitting unit is different from a second direction from the first point to the second point in the second sub-light-emitting unit.

4. The display panel of claim 3, wherein
   a distance between the first point and the second point in the first sub-light-emitting unit (D1) is equal to a distance between the first point and the second point in the second sub-light-emitting unit (D2), and the first direction is opposite to the second direction.

5. The display panel of claim 3, wherein
   the first light-emitting unit comprises a repetitive units group comprising a plurality of light-emitting units of a same color, and each repetitive units group comprises at least one first sub-light-emitting unit and at least one second sub-light-emitting unit.

6. The display panel of claim 1, wherein
   the light-emitting units further comprise a second light-emitting unit, and when viewed from the direction perpendicular to the substrate, a distance between an edge of a pixel opening corresponding to the second light-emitting unit and an edge of a light extraction opening corresponding to the second light-emitting unit is less than 2.5 microns; and
   at least one second light-emitting unit is comprised between two of the first light-emitting units of a same color.

7. The display panel of claim 1, wherein
   the first light-emitting unit further comprises a third point and a fourth point having a minimum distance greater than 4 microns in between when viewed from the direction perpendicular to the substrate, wherein the third point is on an edge of the pixel opening corresponding to the first light-emitting unit, and the fourth point is on an edge of the light extraction opening corresponding to the first light-emitting unit; and
   a first direction from the first point to the second point is opposite to a second direction from the third point to the fourth point.

8. The display panel of claim 1, wherein
   the light-emitting unit comprises sub-light-emitting units of a same color arranged in a matrix, adjacent two of the sub-light-emitting units correspond to a same one of the light extraction openings, the light extraction openings each comprise a first sub-light extraction opening and a second sub-light extraction opening, and in the direction perpendicular to the substrate, the first sub-light extraction opening overlaps different rows of the sub-light-emitting units, and the second sub-light extraction opening overlaps different columns of the sub-light-emitting units.

9. The display panel of claim 8, wherein
   the first sub-light extraction opening has the same shape as the second sub-light extraction opening.

10. The display panel of claim 1, wherein
    the light-emitting units comprise sub-light-emitting units of a same color arranged in a matrix, wherein in a row direction or a column direction, a sub-light-emitting unit on a $(m+1)^{th}$ row and a $(n+1)^{th}$ column is positioned between a sub-light-emitting unit on a $m^{th}$ row and a $n^{th}$ column and a sub-light-emitting unit on the $m^{th}$ row and the $(n+1)^{th}$ column; where m>0, n>0, and m and n are positive integers; and
    the first light-emitting unit is in the sub-light-emitting units on the $m^{th}$ column, and the third light-emitting unit is in the sub-light-emitting units on the $(m+1)^{th}$ column.

11. The display panel of claim 10, wherein
    a sub-light-emitting unit on the $(m+1)^{th}$ row and a $P^{th}$ column and a sub-light-emitting unit on the $m^{th}$ row and a $(P-1)^{th}$ column correspond to a same one of the light extraction units, and a sub-light-emitting unit on the $(m+1)^{th}$ row and a $Q^{th}$ column and a sub-light-emitting unit on the $(m+1)^{th}$ row and a $K^{th}$ column correspond to a same one of the light extraction units; where P>2, Q>2, P and Q are positive integers, and $K=Q\pm1$.

12. The display panel of claim 11, wherein
    $Q=P+4$.

13. The display panel of claim 1, wherein
the light extraction openings are annular openings.

14. A display device comprising a display panel, wherein the display panel comprises:
a substrate;
a plurality of light-emitting units;
a pixel definition layer on a side of the substrate, the pixel definition layer comprising a plurality of pixel openings each defining a respective one of the light-emitting units, the light-emitting units comprising a first light-emitting unit;
a light extraction layer on a side of the pixel definition layer away from the substrate, the light extraction layer comprising a plurality of light extraction openings overlapping the pixel openings in a direction perpendicular to the substrate;
a matching layer on a side of the light extraction layer away from the substrate, the matching layer having a refractive index greater than that of the light extraction layer;
wherein when viewed from the direction perpendicular to the substrate, a minimum distance between a first point on an edge of a pixel opening corresponding to the first light-emitting unit and a second point on an edge of a light extraction opening corresponding to the first light-emitting unit is greater than 4 microns,
wherein a single light extraction opening overlaps at least two of the pixel openings in the direction perpendicular to the substrate,
wherein the light-emitting units comprise a third light-emitting unit, and the first light-emitting unit and the third light-emitting unit overlap a same light extraction opening; and the first light-emitting unit and the third light-emitting unit are to emit light of a same color,
wherein a light extraction opening comprises a first sub-light extraction opening, a second sub-light extraction opening and a connection opening, the first sub-light extraction opening overlaps the first light-emitting unit, the second sub-light extraction opening overlaps the third light-emitting unit, and the connection opening connects the first light extraction opening to the second light extraction opening; and a width of the connection opening is less than a width of the first light extraction opening and a width of the second light extraction opening in a third direction perpendicular to a direction from the first light-emitting unit to the third light-emitting unit.

15. A display panel, comprising:
a substrate;
a plurality of light-emitting units;
a pixel definition layer on a side of the substrate, the pixel definition layer comprising a plurality of pixel openings each defining a respective one of the light-emitting units, the light-emitting units comprising a first light-emitting unit;
a light extraction layer on a side of the pixel definition layer away from the substrate, the light extraction layer comprising a plurality of light extraction openings overlapping the pixel openings in a direction perpendicular to the substrate;
a matching layer on a side of the light extraction layer away from the substrate, the matching layer having a refractive index greater than that of the light extraction layer;
wherein when viewed from the direction perpendicular to the substrate, a minimum distance between a first point on an edge of a pixel opening corresponding to the first light-emitting unit and a second point on an edge of a light extraction opening corresponding to the first light-emitting unit is greater than 4 microns,
wherein a single light extraction opening overlaps at least two of the pixel openings in the direction perpendicular to the substrate,
wherein the light-emitting units comprise a fourth light-emitting unit, and the first light-emitting unit and the fourth light-emitting unit overlap a same one of the light extraction openings; and the first light-emitting unit is to emit light of a different color than the light emitted by the fourth light-emitting unit,
wherein the light extraction openings comprise a third sub-light extraction opening, a fourth sub-light extraction opening and a connection opening, the third sub-light extraction opening overlaps the first light-emitting unit, the fourth sub-light extraction opening overlaps the fourth light-emitting unit, and the connection opening connects the third sub-light extraction opening to the fourth sub-light extraction opening; and a width of the connection opening is less than a width of the third sub-light extraction opening and a width of the fourth sub-light extraction opening in a third direction perpendicular to a direction from the first light-emitting unit to the fourth light-emitting unit.

16. The display panel of claim 15, wherein
the first light-emitting unit has an area smaller than an area of the fourth light-emitting unit, and the connection opening has a width at a side close to the first light-emitting unit that is smaller than a width of the connection opening at a side close to the fourth light-emitting unit.

* * * * *